(12) United States Patent
Corsi

(10) Patent No.: US 6,249,184 B1
(45) Date of Patent: Jun. 19, 2001

(54) RAIL-TO-RAIL INPUT STAGE

(75) Inventor: Marco Corsi, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/452,029

(22) Filed: Nov. 30, 1999

(51) Int. Cl.[7] ........................................... H03F 3/45
(52) U.S. Cl. ............................................ 330/252; 330/255
(58) Field of Search ..................... 330/252, 253, 330/255, 257

(56) References Cited

U.S. PATENT DOCUMENTS

| | | | |
|---|---|---|---|
| 5,138,276 | * 8/1992 | Marie | 330/252 |
| 5,392,002 | * 2/1995 | Delano | 330/252 |
| 5,532,644 | * 7/1996 | Nakagawara | 330/254 |
| 5,621,356 | * 4/1997 | Phillippe | 330/252 |
| 6,054,897 | * 4/2000 | Sugawara | 330/252 |

* cited by examiner

*Primary Examiner*—Robert Pascal
*Assistant Examiner*—Henry Choe
(74) *Attorney, Agent, or Firm*—April M. Mosby; W. James Brady; Frederick J. Telecky, Jr.

(57) ABSTRACT

A rail-to-rail input stage (20) for an operational amplifier having a constant transconductance (Gm) over a common mode range. The input stage has a cross-coupled quad circuit (Q9, Q10, Q15, Q16) having an essentially infinite transconductance, and pair of transistors (Q5, 6) running at the same current as input transistors (Q1, Q2) when active, whereby the pair of transistors (Q5, Q6) establish a constant transconductance of the input stage (20).

8 Claims, 1 Drawing Sheet

RAIL-TO-RAIL INPUT STAGE

TECHNICAL FIELD

The present invention is generally related to integrated amplifier circuits, and more particularly to operational amplifier circuits and input stages therefore.

BACKGROUND OF THE INVENTION

Operational amplifiers, commonly referred to as Op Amps, are integrated circuit amplifiers that have two inputs, one commonly referred to as the positive or non-inverting input, and a negative input commonly referred to as the inverting input. The operational amplifier has a single output. Operational amplifiers form a portion of numerous circuit designs, and are typically implemented into circuits to form functional circuits such as inverters, comparators, and voltage regulators just to name a few.

Operational amplifiers fabricated on a semiconductor wafer are formed by numerous subcircuits including input stages, buffering stages, output stages. In each of these various stages there are defined components forming current sources, current mirrors, amplification stages and voltage rails, one rail adapted to receive a voltage source having a potential greater than the other rail, which is typically tied to ground but may have other voltage potentials depending on the implementation.

With specific reference to input stages for Op Amps, one relatively simple prior art input stage is shown in FIG. 1 and depicted at 10. FIG. 1 shows a first pair of transistors Q9 and Q10 along with transistors Q5 and Q6 forming on differential input, and transistors Q1 and Q2 forming another differential input. When the differential input formed by Q9, Q10, Q5 and Q6 is on, the transconductance (Gm) is half of that produced by the pair of transistors Q1 and Q2. This input stage is a good approach in that it can be easily implemented in a normal operational amplifier. The problem with this approach is that when the common mode range reaches the positive rail, the transconductance of the input stage halves.

There is desired improved input rail-to-rail input stage for operational amplifiers having the improved transconductance.

SUMMARY OF THE INVENTION

The present invention achieves technical advantages as a rail-to-rail input stage for an operational amplifier having a constant transconductance over a common mode range. Two transistors form a current mirror such that two transistors of one differential input run at the same current as two transistors forming another differential input when active.

The present invention achieves technical advantages by providing a cross-coupled quad in a rail-to-rail input stage of an operational amplifier establishing essentially an infinite transconductance, allowing the transconductance to be established and determined by a pair of transistors forming one differential input of the operational amplifier. Four transistors forming the cross-coupled quad, which can be MOSFETs or BJTs, do not contribute to the transconductance, therefore, the transconductance with either input stage active is the same.

BRIEF DESCRIPTION OF THE DRAWINGS

Other aspects of the invention including specific embodiments are understood by reference to the following detail description taken in conjunction with the detail drawings in which.

DETAILED DESCRIPTION OF PREFERRED EMBODIMENTS

Figure 1:
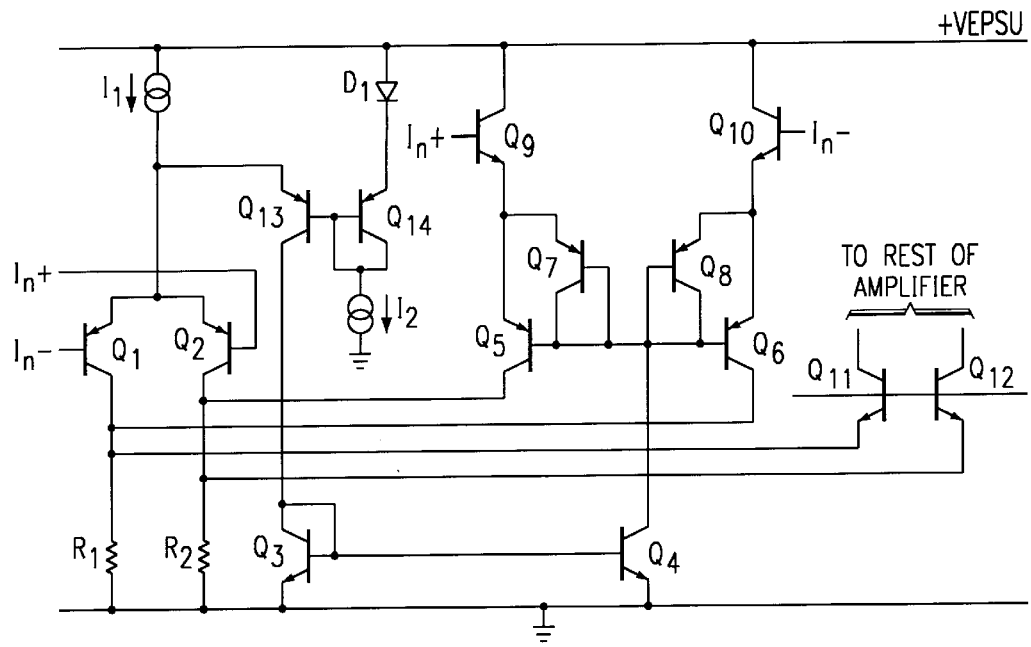
FIG. 1 is a schematic diagram of a prior art rail-to-rail input stage for an operational amplifier.
Figure 2:
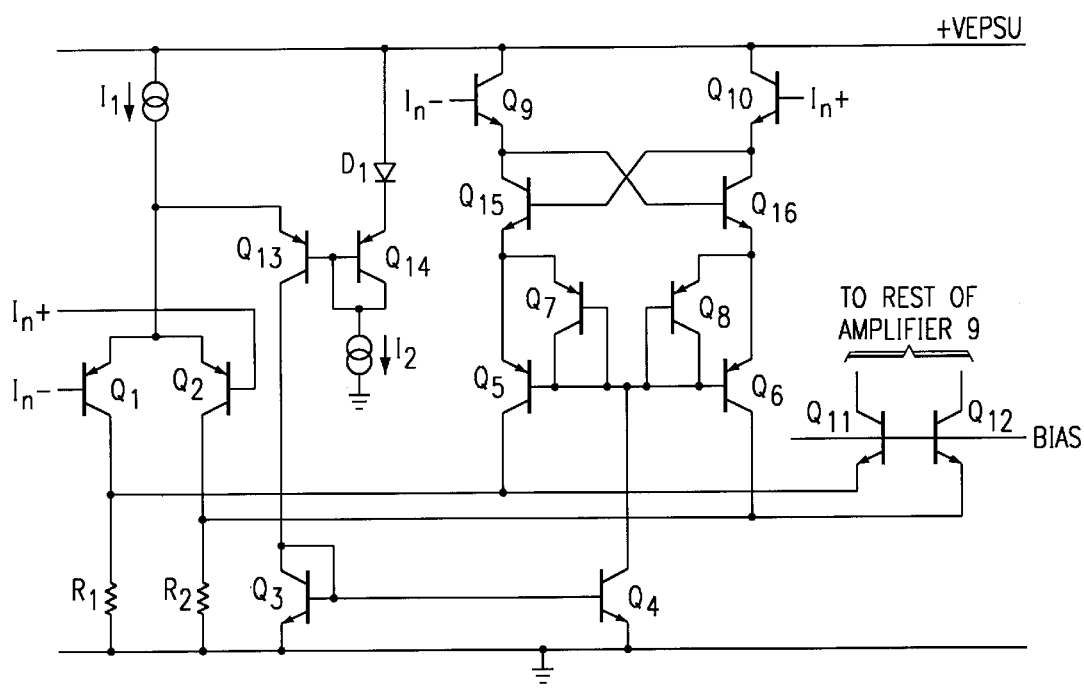
FIG. 2 is a schematic diagram of one preferred embodiment of the present invention shown as a rail-to-rail input stage for an operational amplifier having a cross-coupled quad having a transconductance is essentially infinite.

Referring now to FIG. 2 there is generally shown at 20 a schematic diagram of the one preferred embodiment to the present invention. Circuit 20 is seen to have a first pair of inputs shown as In + and In − coupled to the bases of respective transistors Q1 and Q2 forming a first differential input, and a second differential input being defined at the bases of transistors Q9 and Q10. A current source depicted as $I_1$ is seen to be coupled to transistor pair Q1 and Q2. Transistor Q1 has a collector resister R, and transistor Q2 has a corresponding a collector resistor R2. The collector's of transistors Q1 and Q2 are also coupled to the emitters of respective biasing transistors Q11 and Q12, as shown.

Transistors Q9 and Q10 form a second differential input, and according to the present invention, the respective emitters are tied to the bases of respective transistors Q16 and Q15 to form a cross-coupled quad whose transconductance (Gm) is essentially infinite. Advantageously, according to the present invention, the transconductance of the input of circuit 20 is thus set and determined by the pair of transistors Q5 and Q6.

The present invention achieves technical advantages whereby transistors Q5 and Q6 operate at the same current as input transistors Q1 and Q2 and form a current mirror at transistors Q1 and Q2 when active. The NPN transistors Q9, Q10, Q15, and Q16 do not contribute to the transconductance of the input stage 20, and therefore, the transconductance of either input stage is the same when active. The present invention overcomes limitations of a prior art rail-to-rail input stage for an operational amplifier having a constant transconductance over a common mode range of operation.

The present invention is depicted in FIG. 2 as being formed by bipolar junction transistors (BJTs), although it is to be understood by one of ordinary skill in the art that such a circuit could be implemented in other semiconductor technologies including using MOSFETS, wherein the NPN transistors would be replaced with N-channel MOSFETS, and the PNP transistors would be replaced with P-channel MOSFETS and would operate essentially along the same principles of operation as just described.

While the invention has been described in conjunction with preferred embodiments, it should be understood that modifications will become apparent to those of ordinary skill in the art and that such modifications are therein to be included within the scope of the invention and the following claims.

What is claimed is:

1. A rail-to-rail input stage forming a portion of an operational amplifier having a first rail and a second rail, comprising:

a first pair of transistors adapted to receive a first differential input signal and coupled between the first rail and the second rail;

a cross-coupled quad adapted to receive a second differential input signal and coupled to the first rail;

a second pair of transistors coupled between said cross-coupled quad and the second rail such that a transconductance of the input stage is primarily established by said second pair of transistors; and a current mirror adapted to establish a first current conducting through said first pair of transistors being substantially the same as a second current conducting through said second pair of transistors.

2. The rail-to-rail input stage of claim 1 further comprising a third pair of transistors coupled to said second pair of transistors configured as diodes.

3. The rail-to-rail input stage of claim 1 wherein all said transistors comprise Bipolar Junction Transistors (BJTs).

4. The rail-to-rail input stage of claim 1 wherein all said transistors comprise Metal Oxide Semiconductor Field Effect Transistors (MOSFETs).

5. The rail-to-rail input stage of claim 1 wherein said cross-coupled quad is configured to have essentially infinite transconductance ($G_m$).

6. The rail-to-rail input stage of claim 1 wherein said cross-coupled quad is configured in the rail-to-rail input stage such that transconductance of the input stage is constant over a common mode range.

7. A method of operating a rail-to-rail input stage for an operational amplifier, comprising the step of:

providing a cross-coupled quad in the input stage having essentially infinite transconductance and being coupled to a pair of transistors that establish a transconductance of the input stage, wherein said cross-coupled quad is operated such that the transconductance of the input stage is constant over a common mode range; and providing a current mirror in the input stage to establish a first current through said cross-coupled quad that is substantially identical to a second current conducting through said pair of transistors.

8. The method of claim 7 further comprising a second pair of transistors coupled to the cross-coupled quad establishing a transconductance of the input stage.

* * * * *